(12) United States Patent
Chang et al.

(10) Patent No.: US 11,139,744 B2
(45) Date of Patent: Oct. 5, 2021

(54) FLYBACK POWER CONVERTER AND SECONDARY SIDE CONTROLLER CIRCUIT AND CONTROL METHOD THEREOF

(71) Applicant: RICHTEK TECHNOLOGY CORPORATION, Zhubei (TW)

(72) Inventors: Wei-Hsu Chang, Hsinchu (TW); Ta-Yung Yang, Taoyuan (TW); Yu-Chang Chen, Nantou (TW); Chao-Chi Chen, New Taipei (TW); Chuh-Ching Li, Hsinchu (TW); Li-Di Lo, Taichung (TW); Hao-Wen Chung, Hsinchu (TW)

(73) Assignee: RICHTEK TECHNOLOGY CORPORATION, Zhubei (TW)

( * ) Notice: Subject to any disclaimer, the term of this patent is extended or adjusted under 35 U.S.C. 154(b) by 9 days.

(21) Appl. No.: 16/888,923

(22) Filed: Jun. 1, 2020

(65) Prior Publication Data

US 2021/0111634 A1    Apr. 15, 2021

Related U.S. Application Data

(60) Provisional application No. 62/915,622, filed on Oct. 15, 2019.

(30) Foreign Application Priority Data

Feb. 7, 2020  (TW) .................................. 109103973

(51) Int. Cl.
*H02M 3/335* (2006.01)
*G01R 19/165* (2006.01)
(Continued)

(52) U.S. Cl.
CPC .. *H02M 3/33592* (2013.01); *G01R 19/16528* (2013.01); *H03M 1/1245* (2013.01);
(Continued)

(58) Field of Classification Search
CPC ............. H02M 3/335; H02M 3/33523; H02M 3/33569; H02M 3/33576; H02M 3/33592;
(Continued)

(56) References Cited

U.S. PATENT DOCUMENTS 10,291,136 B2 * 5/2019 Song .................. H02M 3/33523
10,333,418 B2 * 6/2019 Song .................. H02M 3/33592
(Continued)

OTHER PUBLICATIONS

"A Novel Soft Switching Flyback Converter with Synchronous Rectification", by W. Yuan et al., IEEE IPEMC, 2009.
(Continued)

*Primary Examiner* — Yemane Mehari
(74) *Attorney, Agent, or Firm* — Tung & Associates

(57) ABSTRACT

A flyback power converter includes a primary side controller circuit for controlling a primary side switch; and a secondary side controller circuit for generating an SR (Synchronous Rectification) signal to control an SR switch. The SR signal includes an SR pulse and a ZVS (Zero Voltage Switching) pulse. The SR pulse controls the SR switch for synchronous rectification at the secondary side. The secondary side controller circuit samples and holds a voltage at a first end of the SR switch as a first voltage at a timing between the end of the ZVS pulse and the beginning of the SR pulse, and determines a length of the ZVS pulse so as to control the SR switch to be conductive for a ZVS time period, whereby the primary side switch achieves ZVS. The first voltage is proportional to an input voltage.

24 Claims, 12 Drawing Sheets

(51) Int. Cl.
*H03M 1/12* (2006.01)
*H02M 1/00* (2006.01)

(52) U.S. Cl.
CPC ........ *H02M 1/0006* (2021.05); *H02M 1/0025* (2021.05); *H02M 1/0058* (2021.05)

(58) Field of Classification Search
CPC ............. H02M 1/0006; H02M 1/0009; H02M 1/0025; H02M 1/0058; H02M 1/1245; G01R 19/16528
USPC ........................................................ 323/282
See application file for complete search history.

(56) References Cited

U.S. PATENT DOCUMENTS

| | | | | |
|---|---|---|---|---|
| 10,560,012 | B1 * | 2/2020 | Yang | H02M 3/33592 |
| 10,715,028 | B2 * | 7/2020 | Lin | H02M 1/083 |
| 10,868,473 | B2 * | 12/2020 | Chang | H02M 1/08 |
| 10,972,014 | B2 * | 4/2021 | Jitaru | H02M 3/33592 |
| 10,998,828 | B2 * | 5/2021 | Hara | H02M 3/33592 |
| 11,005,382 | B2 * | 5/2021 | Hara | H02M 1/08 |

OTHER PUBLICATIONS

"A Novel Variable Frequency Soft Switching Method for Flyback Converter with Synchronous Rectifier", by X. Huang et al., IEEE, 2010.

* cited by examiner

FLYBACK POWER CONVERTER AND SECONDARY SIDE CONTROLLER CIRCUIT AND CONTROL METHOD THEREOF

CROSS REFERENCE

The present invention claims priority to U.S. 62/915,622 filed on Oct. 15, 2019 and claims priority to TW 109103973 filed on Feb. 7, 2020.

BACKGROUND OF THE INVENTION

Field of Invention

The present invention relates to a flyback power converter; particularly, it relates to such flyback power converter capable of achieving zero voltage switching (ZVS). The present invention also relates to a secondary side controller circuit and a control method for use in a flyback power converter.

Description of Related Art

Prior arts relevant to this invention are: "A Novel Soft Switching Flyback Converter with Synchronous Rectification", by W. Yuan et al., IEEE IPEMC, 2009, and "A Novel Variable Frequency Soft Switching Method for Flyback Converter with Synchronous Rectifier", by X. Huang et al., IEEE, 2010.

Please refer to FIG. 1A. For the flyback power converter 1000 shown in FIG. 1A to achieve zero voltage switching (ZVS), the synchronous rectification (SR) signal S2C of the flyback power converter 1000 should include an SR pulse and a ZVS pulse, and according to the above-mentioned reference documents, the ZVS pulse has a ZVS period T_ZVS, which has an optimum solution as expressed by following equation (1):

$$T\_ZVS = \frac{\sqrt{[Vin^2 - (nVo)^2]\frac{Cp}{Lm}}}{nVo} \quad \text{eq. 1}$$

wherein Vin denotes an input voltage, Vo denotes an output voltage, n denotes a turn ratio of a primary side winding W1 to a secondary side winding W2, Cp denotes parasitic capacitance of parasitic capacitor of a primary side switch S1, Lm denotes leakage inductance of a primary side winding W1.

The question is how to precisely achieve the above-mentioned equation and realize it in the practical circuitry. In this regard, the present invention proposes a circuit and a method capable of effectively obtaining parameters such as the input voltage Vin and the output voltage Vo to determine the ZVS period T_ZVS, so as to control the primary side switch S1 accurately to precisely achieve zero voltage switching, for enhancing power conversion efficiency.

SUMMARY OF THE INVENTION

From one perspective, the present invention provides a flyback power converter, which is configured to operably convert an input voltage to an output voltage; the flyback power converter comprising: a power transformer, which is coupled between the input voltage and the output voltage; a primary side switch, which is coupled to a primary side winding of the power transformer, wherein the primary side winding is coupled to the input voltage; a synchronous rectification (SR) switch, wherein a secondary side winding of the power transformer and the SR switch are coupled in series to each other between the output voltage and a secondary side ground node; a primary side controller circuit, which is configured to operably generate a switching signal, to control the primary side switch, thereby controlling the primary side winding of the power transformer; and a secondary side controller circuit, which is configured to operably generate an SR signal, to control the SR switch, thereby controlling the secondary side winding of the power transformer to generate output voltage, wherein the SR signal includes an SR pulse and a zero voltage switching (ZVS) pulse, wherein the SR pulse is configured to operably control the SR switch to be ON for an SR period, to achieve synchronous rectification at the secondary side, and wherein the ZVS pulse is configured to operably control the SR switch to be ON for a ZVS period, thereby achieving zero voltage switching of the primary side switch; wherein during a period between an ending time point of the ZVS pulse to a following starting time point of the SR pulse, the secondary side controller circuit is configured to operably sample-and-hold a voltage of a first end of the SR switch to be a first voltage and the secondary side controller circuit is configured to operably determine a length of the ZVS period according to the first voltage, wherein the first voltage is proportional to the input voltage, and wherein the first end of the SR switch corresponds to a current output end or a current input end of the SR switch.

In one embodiment, the secondary side controller circuit includes: a sample-and-hold circuit, which is configured to operably sample-and-hold the voltage of the first end of the SR switch to be the first voltage during the period between the ending time point of the ZVS pulse to the following starting time point of the SR pulse; a level comparison circuit, which is configured to operably compare the first voltage with at least one reference level, to generate a first comparison result corresponding to the first voltage; and a time generation circuit, which is configured to operably determine the length of the ZVS period according to the first comparison result corresponding to the first voltage.

In one embodiment, the secondary side controller circuit is configured to operably determine the length of the ZVS period further according to the output voltage.

In one embodiment, the secondary side controller circuit is directly coupled to the output voltage, to operably determine the length of the ZVS period further according to the output voltage.

In one embodiment, during a period between an ending time point of the SR pulse to a following starting time point of the ZVS pulse, the secondary side controller circuit is configured to operably sample-and-hold a voltage of the first end of the SR switch to be a second voltage and the secondary side controller circuit is configured to operably determine the length of the ZVS period further according to the second voltage, wherein the second voltage is proportional to the output voltage.

In one embodiment, the sample-and-hold circuit is further configured to operably sample-and-hold the voltage of the first end of the SR switch to be the second voltage during the period between the ending time point of the SR pulse to the following starting time point of the ZVS pulse; the level comparison circuit is further configured to operably compare the second voltage with the least one reference level, to generate a second comparison result corresponding to the second voltage; and the time generation circuit is further configured to operably determine the length of the ZVS period further according to the second comparison result corresponding to the second voltage.

In one embodiment, the secondary side controller circuit further includes: a selection circuit, which is configured to operably determine whether the level comparison circuit receives the first voltage or the output voltage; wherein when the level comparison circuit receives the first voltage, the level comparison circuit is configured to operably compare the first voltage with the at least one reference level, to generate the first comparison result corresponding to the first voltage; wherein when the level comparison circuit receives the output voltage, the level comparison circuit is configured to operably compare the output voltage with the at least one reference level, to generate the second comparison result corresponding to the second voltage; wherein the time generation circuit is configured to operably determine the length of the ZVS period according to the first comparison result corresponding to the first voltage and the second comparison result corresponding to the second voltage.

In one embodiment, the secondary side controller circuit is configured to operably sample-and-hold the voltage of the first end of the SR switch to be the first voltage after a delay period from an ending time point of the ZVS pulse; wherein at the ending time point of the delay period, the voltage of the first end of the SR switch has already been stable.

In one embodiment, starting from an ending time point of the ZVS pulse, the secondary side controller circuit is configured to operably sample-and-hold the voltage of the first end of the SR switch for plural times until a difference between two consecutive sample-and-hold results is smaller than a predetermined difference threshold; wherein under a situation where the two consecutive sample-and-hold results is smaller than the predetermined difference threshold, the secondary side controller circuit takes a last sample-and-hold result as the first voltage.

In one embodiment, the input voltage is equal to n-fold of the first voltage, wherein n is a turn ratio of the primary side winding to the secondary side winding.

In one embodiment, the flyback power converter operates under a discontinuous conduction mode (DCM) or a boundary conduction mode (BCM).

In one embodiment, the level comparison circuit is configured as one of the following: (1) the level comparison circuit includes: a digital-to-analog conversion circuit, which is configured to operably generate the at least one reference level in analog form; and a voltage comparison circuit, which is configured to operably compare the first voltage with the at least one reference level in analog form, to generate the first comparison result; or (2) the level comparison circuit includes: an analog-to-digital conversion circuit, which is configured to operably convert the first voltage to a first digital code corresponding to the first voltage; and a digital comparison circuit, which is configured to operably compare the first digital code with a digital level, to generate the first comparison result, wherein the digital level corresponds to the at least one reference level.

From another perspective, the present invention provides a secondary side controller circuit, which is configured to operably control a flyback power converter, wherein the flyback power converter is configured to operably convert an input voltage to an output voltage, the flyback power converter including: a power transformer, which is coupled between the input voltage and the output voltage; a primary side switch, which is coupled to a primary side winding of the power transformer, wherein the primary side winding is coupled to the input voltage; a synchronous rectification (SR) switch, wherein a secondary side winding of the power transformer and the SR switch are coupled in series to each other between the output voltage and a secondary side ground node; and a primary side controller circuit, which is configured to operably generate a switching signal, to control the primary side switch, thereby controlling the primary side winding of the power transformer; wherein the secondary side controller circuit is configured to operably generate an SR signal, to control the SR switch, thereby controlling the secondary side winding of the power transformer, so as to generate output voltage, wherein the SR signal includes an SR pulse and a zero voltage switching (ZVS) pulse, wherein the SR pulse is configured to operably control the SR switch to be ON for an SR period, to achieve synchronous rectification at the secondary side, and wherein the ZVS pulse is configured to operably control the SR switch to be ON for a ZVS period, thereby achieving zero voltage switching of the primary side switch; the secondary side controller circuit comprising: a sample-and-hold circuit, which is configured to operably sample-and-hold a voltage of a first end of the SR switch to be a first voltage during a period between an ending time point of the ZVS pulse to a following starting time point of the SR pulse, wherein the first voltage is proportional to the input voltage, and wherein the first end of the SR switch corresponds to a current output end or a current input end of the SR switch; and a time generation circuit, which is configured to operably determine the length of the ZVS period according to the first voltage.

From yet another perspective, the present invention provides a control method, which is configured to operably control a flyback power converter, wherein the flyback power converter is configured to operably convert an input voltage to an output voltage, the flyback power converter including: a power transformer, which is coupled between the input voltage and the output voltage; a primary side switch, which is coupled to a primary side winding of the power transformer, wherein the primary side winding is coupled to the input voltage; a synchronous rectification (SR) switch, wherein a secondary side winding of the power transformer and the SR switch are coupled in series to each other between the output voltage and a secondary side ground node; and a primary side controller circuit, which is configured to operably generate a switching signal, to control the primary side switch, thereby controlling the primary side winding of the power transformer; wherein the secondary side controller circuit is configured to operably generate an SR signal, to control the SR switch, thereby controlling the secondary side winding of the power transformer to generate output voltage, wherein the SR signal includes an SR pulse and a zero voltage switching (ZVS) pulse, wherein the SR pulse is configured to operably control the SR switch to be ON for an SR period, to achieve synchronous rectification at the secondary side, and wherein the ZVS pulse is configured to operably control the SR switch to be ON for a ZVS period, thereby achieving zero voltage switching of the primary side switch; the control method comprising: during a period between an ending time point of the ZVS pulse to a following starting time point of the SR pulse, sampling-and-holding a voltage of a first end of the SR switch to be a first voltage, wherein the first voltage is proportional to the input voltage, and wherein the first end of the SR switch corresponds to a current output end or a current input end of the SR switch; and determining a length of the ZVS period according to the first voltage.

In one embodiment, the control method further comprises: during a period between an ending time point of the SR pulse to a following starting time point of the ZVS pulse, sampling-and-holding a voltage of the first end of the SR switch to be a second voltage; and determining the length of the ZVS period according to the second voltage, wherein the second voltage is proportional to the output voltage.

In one embodiment, the step of sampling-and-holding the voltage of the first end of the SR switch to be the first voltage includes: sampling-and-holding the voltage of the first end of the SR switch to be the first voltage after a delay period from an ending time point of the ZVS pulse; wherein at the ending time point of the delay period, the voltage of the first end of the SR switch has already been stable.

In one embodiment, the step of sampling-and-holding the voltage of the first end of the SR switch to be the first voltage includes: starting from an ending time point of the ZVS pulse, sampling-and-holding the voltage of the first end of the SR switch for plural times until a difference between two consecutive sample-and-hold results is smaller than a predetermined difference threshold; and when the two consecutive sample-and-hold results is smaller than the predetermined difference threshold, taking a last sample-and-hold result as the first voltage.

The objectives, technical details, features, and effects of the present invention will be better understood with regard to the detailed description of the embodiments below, with reference to the attached drawings.

DESCRIPTION OF THE PREFERRED EMBODIMENTS

The drawings as referred to throughout the description of the present invention are for illustration only, to show the interrelations between the circuits and the signal waveforms, but not drawn according to actual scale of circuit sizes and signal amplitudes and frequencies.

Figure 1A:
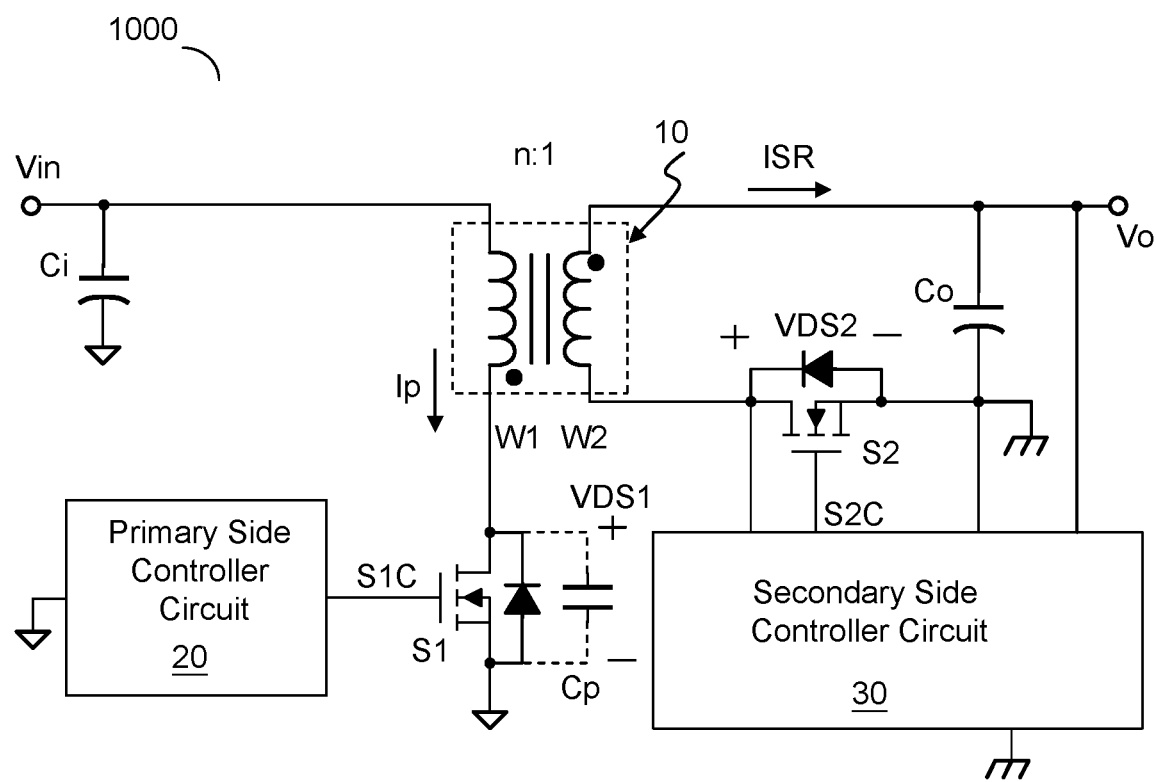
FIG. 1A shows a schematic diagram of a flyback power converter according to an embodiment of the present invention.

Please refer to FIG. 1A, which shows a schematic diagram of a flyback power converter (i.e., flyback power converter 1000) according to an embodiment of the present invention. The flyback power converter 1000 is configured to operably convert an input voltage Vin to an output voltage Vo. The flyback power converter 1000 comprises: a power transformer 10, a primary side switch S1, a synchronous rectification (SR) switch S2, a primary side controller circuit 20 and a secondary side controller circuit 30.

The power transformer 10 is coupled between the input voltage Vin and the output voltage Vo. The primary side switch S1 is coupled to a primary side winding W1 of the power transformer 10. The primary side winding W1 is coupled to the input voltage Vin. The SR switch S2 and the secondary side winding W2 of the power transformer 10 are coupled in series to each other between the output voltage Vo and a secondary side ground node. In this embodiment, the SR switch S2 is coupled between the secondary side winding W2 of the power transformer 10 and the secondary side ground node.

Figure 1B:
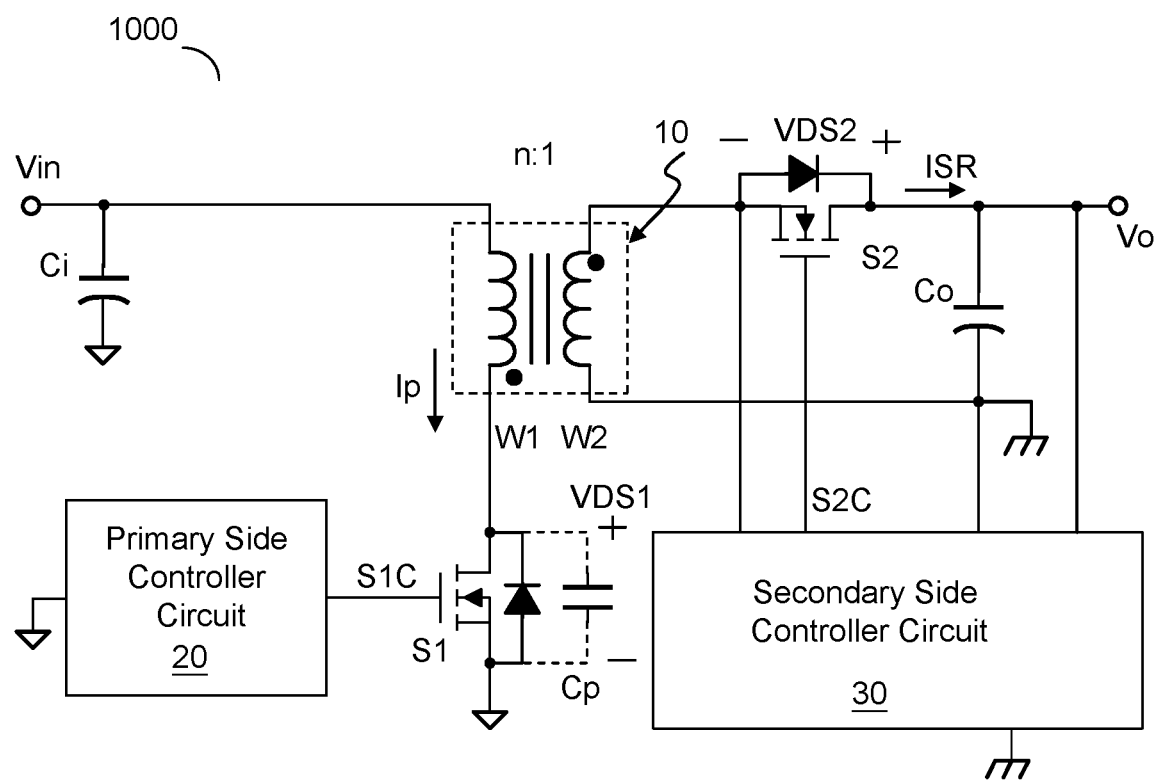
FIG. 1B shows a schematic diagram of a flyback power converter according to another embodiment of the present invention.

Please refer to FIG. 1B, which shows a schematic diagram of a flyback power converter according to another embodiment of the present invention. This embodiment is similar to the embodiment of FIG. 1A, but is different in that: in this embodiment, the SR switch S2 is coupled between the secondary side winding W2 of the power transformer 10 and the output voltage Vo. For simplicity in explaining the concepts of the present invention, the following description will focus on the implementation wherein the SR switch S2 is coupled between the secondary side winding W2 of the power transformer 10 and the secondary side ground node (i.e., the embodiment shown in FIG. 1A); however certainly, the spirit of the present invention can also apply to the implementation wherein the SR switch S2 is coupled between the secondary side winding W2 of the power transformer 10 and the output voltage Vo (i.e., the embodiment shown in FIG. 1B).

Please still refer to FIG. 1A. The primary side controller circuit 20 is configured to operably generate a switching signal S1C for controlling the primary side switch S1, thereby controlling the primary side winding W1 of the power transformer 10. The secondary side controller circuit 30 is configured to operably generate an SR signal S2C for controlling the operation of the SR switch S2, thereby controlling the secondary side winding W2 of the power transformer 10 to generate output voltage Vo. Voltage VDS1 denotes a drain voltage of the primary side switch S1, whereas, voltage VDS2 denotes a voltage of a first end of the SR switch S2. In this embodiment, the "first end of the SR switch S2" indicates a drain (i.e., a current output end) of the SR switch S2 and the "second end of the SR switch S2" indicates a source (i.e., a current input end) of the SR switch S2. But in the embodiment wherein the SR switch S2 is coupled between the secondary side winding W2 of the power transformer 10 and the output voltage Vo (i.e., the embodiment shown in FIG. 1B), the "first end of the SR switch S2" indicates a source (i.e., a current input end) of the SR switch S2, whereas, the "second end of the SR switch S2" indicates a drain (i.e., a current output end) of the SR switch S2.

Figure 2:
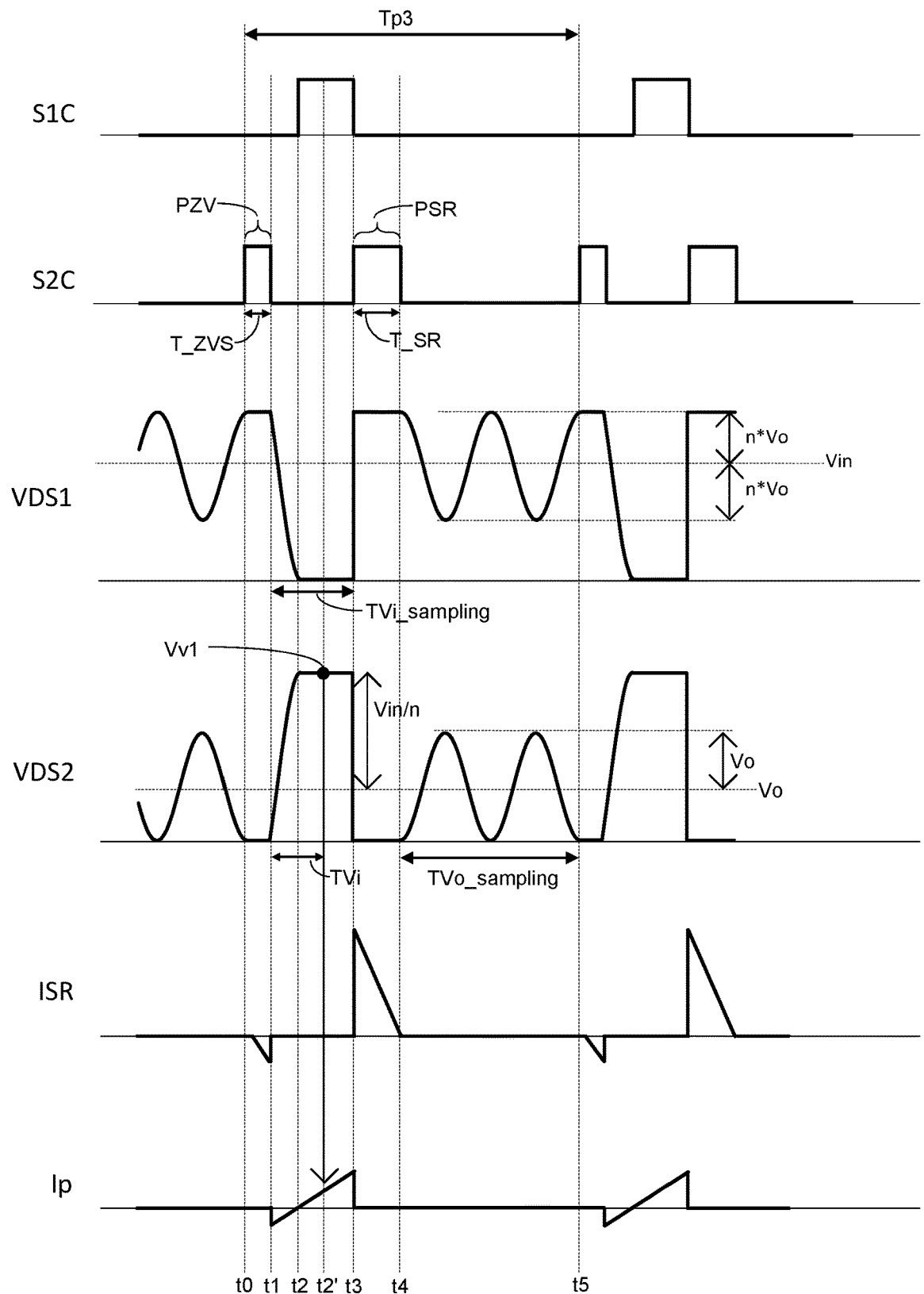
FIG. 2 illustrates a waveform diagram depicting the operation of a flyback power converter according to the present invention.

Please refer to FIG. 2 in conjugation with FIG. 1A. FIG. 2 illustrates a waveform diagram depicting the operation of a flyback power converter. In this embodiment, the flyback power converter 1000 of the present invention operates under a discontinuous conduction mode (DCM). According to the present invention, the SR signal S2C includes an SR pulse PSR and a zero voltage switching (ZVS) pulse PZV. After the primary side switch S1 is turned ON and subsequently OFF (e.g., as shown by the time point t3 in FIG. 2), the SR pulse PSR is configured to operably turn ON the SR switch S2 for an SR period T_SR, to achieve synchronous rectification at the secondary side. The SR period T_SR is substantially synchronous with an ON period of a conduction current of the secondary side winding W2. In other words, the SR period T_SR begins at the time point (i.e., the time point t3) when energy starts being transferred from the primary side winding W1 to the secondary side winding W2 to generate the secondary side current ISR, and the SR period T_SR ends at the time point (i.e., the time point t4) when the secondary side current ISR of the secondary side winding W2 is reduced to zero, thus enhancing the power conversion efficiency.

On the other hand, the ZVS pulse PZV is configured to achieve zero voltage switching of the primary side switch S1. When the power transformer 10 is demagnetized and when the SR switch S2 is turned ON according to the ZVS pulse PZV (e.g., as shown by the time point t0 or t5 in FIG. 2), the power transformer 10 will conduct a negative direction secondary side current ISR through the secondary side winding W2. That is, as shown in FIG. 2, when the secondary side current ISR is negative (e.g., as shown by t0-t1 in FIG. 2), during this period, the secondary side current ISR will transfer energy from the output capacitor Co to the secondary side winding W2. When the ZVS pulse PZV ends and the SR switch S2 is turned OFF (e.g., at the time point t1), the power transformer 10 will conduct a negative direction primary side current Ip at the primary side winding W1; during this period (i.e., from the time point t1 to the time point t2), the negative direction primary side current Ip can discharge a parasitic capacitor Cp of the primary side switch S1 to substantially 0V and store charges to the input capacitor Ci. When the primary side switch S1 is subsequently turned ON, zero voltage switching (ZVS) is achieved.

"Zero voltage switching (ZVS)" refers to: before a transistor (e.g., the primary side switch S1) is turned ON, the residue voltage stored in the parasitic capacitor Cp of this transistor is discharged to 0V via a discharging current through a discharging path without power loss (e.g., via the primary side winding W1), and the charges are stored into a device without power loss (e.g., the input capacitor Ci). As a consequence, when the transistor is turned ON, a drain-source voltage of the transistor has already been reduced to 0V, which is "ZVS". Because discharging process of the parasitic capacitor Cp of this transistor is not subject to an effect of the ON resistance of the transistor, power conversion efficiency is enhanced.

Note that although the parasitic capacitor being discharged to 0V is preferred, however due to non-idealities caused by for example imperfection of components or imperfect matching among components, the voltage of the parasitic capacitor may not be discharged exactly to 0V, but just close to 0V. In other words, according to the present invention, a certain level of error between 0V and the voltage of the parasitic capacitor after discharge is acceptable, and therefore the term "substantially" is used to mean that an insignificant error within a tolerable range is acceptable. Other occurrences of the term "substantially" also mean that an insignificant error within a tolerable range is acceptable.

Please still refer to FIG. 2. In one embodiment, during a period between an ending time point of the ZVS pulse PZV to a following starting time point of the SR pulse PSR, the secondary side controller circuit 30 samples-and-holds a voltage VDS2 of a first end of the SR switch S2, to be a first voltage Vv1, and the secondary side controller circuit 30 determines a length of the ZVS period T_ZVS according to the first voltage Vv1. The first voltage Vv1 is proportional to the input voltage Vin. More specifically, for example as shown in FIG. 2, during a period from the time point t1 to the time point t3 (i.e., period TVi_sampling), the secondary side controller circuit 30 samples-and-holds the voltage VDS2 of the first end of the SR switch S2 to be the first voltage Vv1, and the secondary side controller circuit 30 determines the length of the following ZVS period T_ZVS according to the first voltage Vv1.

In one embodiment, a preferred timing for sampling-and-holding the voltage VDS2 of the first end of the SR switch S2 is after the voltage VDS2 has already been stable. More specifically, during this period (i.e., period TVi_sampling), when the voltage VDS2 of the first end of the SR switch S2 has already been stable, the level of the voltage VDS2 is Vin/n, wherein Vin denotes the input voltage and n denotes a turn ratio of the primary side winding W1 to the secondary side winding W2.

Figure 3:
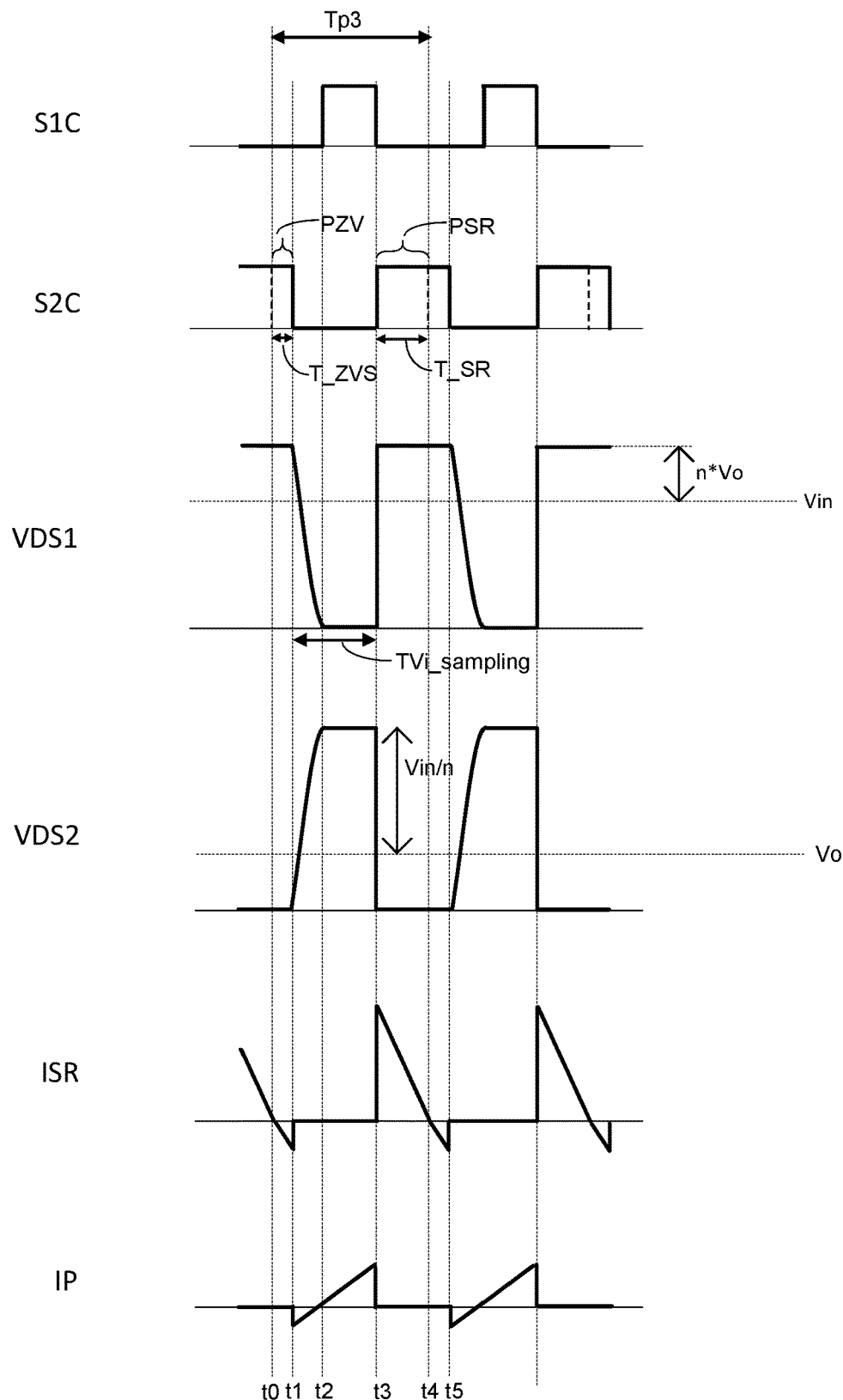
FIG. 3 illustrates a waveform diagram depicting the operation of a flyback power converter according to the present invention.

Please refer to FIG. 3, which illustrates a waveform diagram depicting the operation of a flyback power converter according to the present invention. In this embodiment, the flyback power converter 1000 operates under a boundary conduction mode (BCM). This embodiment is similar to the embodiment of FIG. 2, but is different in that: as shown in FIG. 3, when the SR pulse PSR ends (i.e., when the SR period T_SR ends, e.g. as shown by the time point t4 in FIG. 3, and at this time point the secondary side current ISR is reduced to zero), the ZVS pulse PZV of the SR signal S2C immediately follows (i.e., from the time point t4 to the time point t5, which immediately follows the ending time point t4 of the SR period T_SR). In other words, in this embodiment, the SR pulse PSR of the SR signal S2C is connected to the ZVS pulse PZV of the SR signal S2C, so that the waveform of the SR signal S2C appears to be only one single pulse in one cycle. Note that, in one embodiment, during the SR period T_SR (e.g., from the time point t3 to the time point t4) when the SR pulse PSR is ON, the secondary side current ISR is positive (in this embodiment, the output current is positive), whereas, during the ZVS period T_ZVS (e.g., from the time point t4 to the time point t5) when the ZVS pulse PZV is ON, the secondary side current ISR is negative.

Besides, in this embodiment, during a period (e.g., from the time point t1 to the time point t3 in FIG. 3) between an ending time point of the ZVS pulse PZV to a following starting time point of the SR pulse PSR, the secondary side controller circuit 30 samples-and-holds the voltage VDS2 of the first end of the SR switch S2 to be the first voltage Vv1, and the secondary side controller circuit 30 determines the length of the ZVS period T_ZVS according to the first voltage Vv1. The first voltage Vv1 is proportional to the input voltage Vin.

Figure 4:
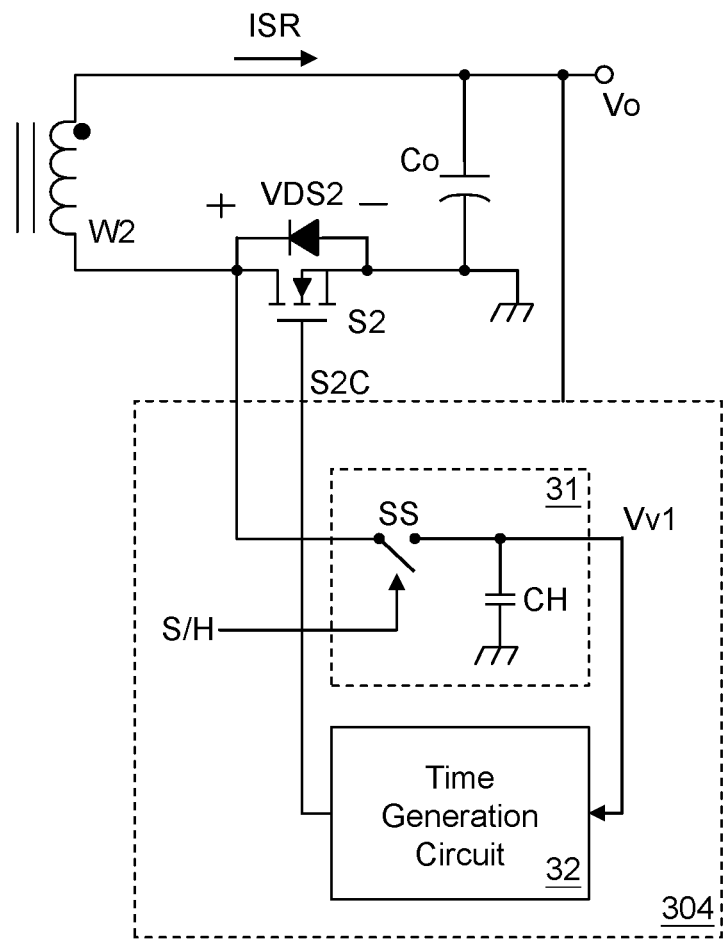
FIG. 4 shows an embodiment of a secondary side controller circuit according to the present invention.

Please refer to FIG. 4, which shows an embodiment of a secondary side controller circuit (i.e., secondary side controller circuit 304) for use in a flyback power converter according to the present invention. In this embodiment, the secondary side controller circuit 304 includes: a sample-and-hold circuit 31 and a time generation circuit 32. The sample-and-hold circuit 31 is configured to operably sample-and-hold the voltage VDS2 of the first end of the SR switch S2 to be the first voltage Vv1, during the period (e.g., from the time point t1 to the time point t3 in FIG. 2 or FIG.

3) between the ending time point of the ZVS pulse PZV to the following starting time point of the SR pulse PSR. The time generation circuit 32 is configured to operably determine the length of the ZVS period T_ZVS according to the first voltage Vv1. A sample-and-hold signal S/H controls the time point when the sample-and-hold circuit 31 should sample-and-hold the voltage VDS2 of the first end of the SR switch S2. In one embodiment, as shown in FIG. 4, the sample-and-hold circuit 31 includes: a sample-and-hold switch SS and a holding capacitor CH.

Figure 5:
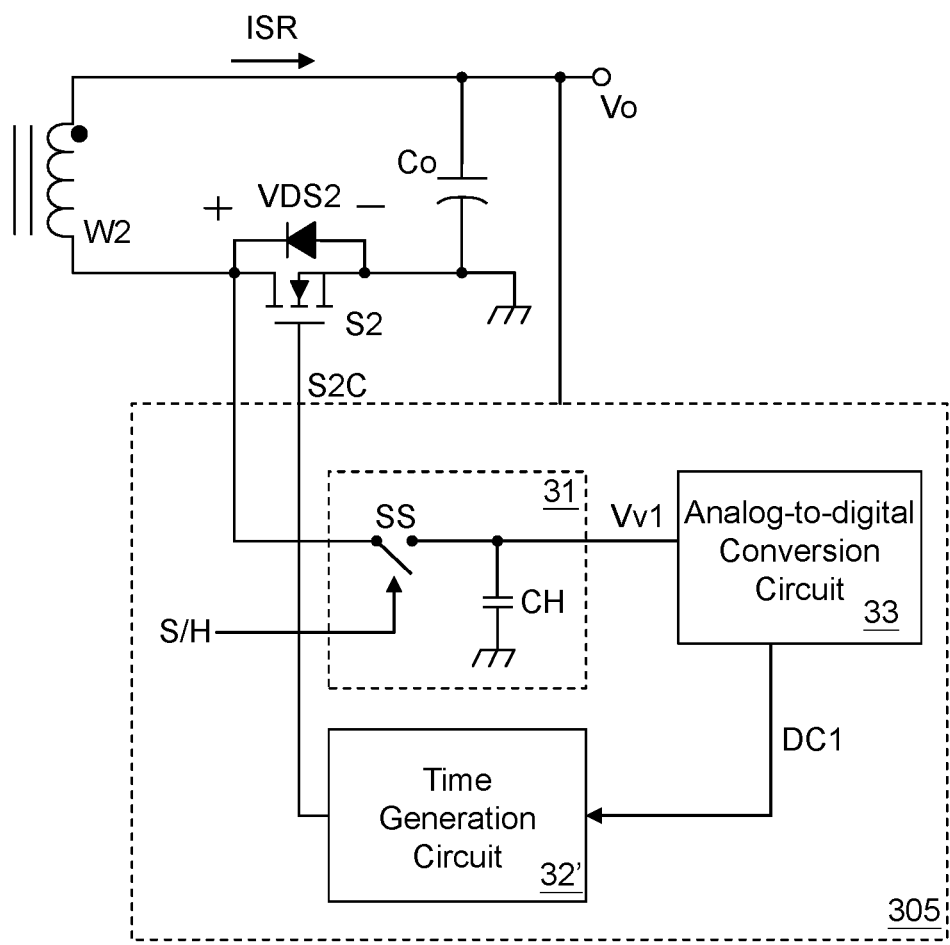
FIG. 5 shows another embodiment of a secondary side controller circuit according to the present invention.

Please refer to FIG. 5, which shows another embodiment of a secondary side controller circuit (i.e., secondary side controller circuit 305) for use in a flyback power converter according to the present invention. In this embodiment, the secondary side controller circuit 305 includes: a sample-and-hold circuit 31, a time generation circuit 32' and an analog-to-digital conversion circuit 33. The sample-and-hold circuit 31 is configured to operably sample-and-hold the voltage VDS2 of the first end of the SR switch S2 to be the first voltage Vv1 during the period (e.g., from the time point t1 to the time point t3 in FIG. 2 or FIG. 3) between the ending time point of the ZVS pulse PZV to the following starting time point of the SR pulse PSR. The analog-to-digital conversion circuit 33 is configured to operably convert the first voltage Vv1 to generate a first digital code DC1 corresponding to the first voltage Vv1.

The time generation circuit 32 is configured to operably determine the length of the ZVS period T_ZVS according to the first digital code DC1.

Figure 6:
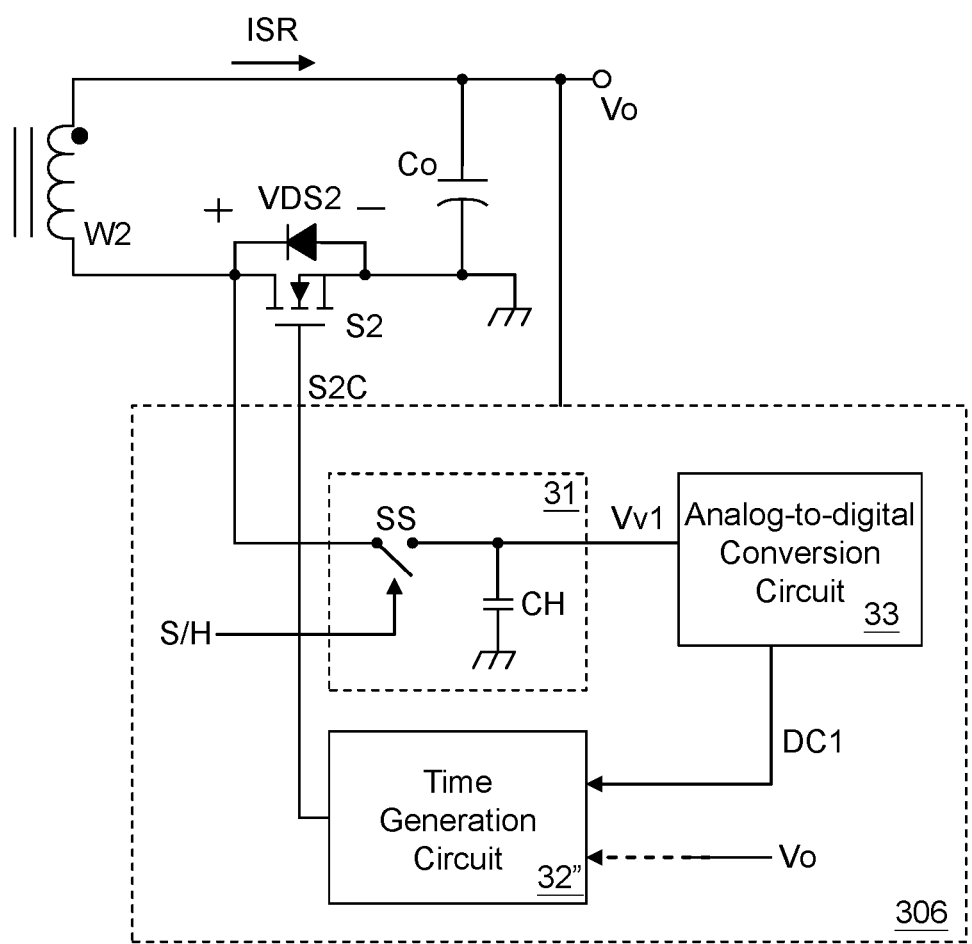
FIG. 6 shows yet another embodiment of a secondary side controller circuit according to the present invention.

Please refer to FIG. 6, which shows yet another embodiment of a secondary side controller circuit (i.e., secondary side controller circuit 306) for use in a flyback power converter according to the present invention. This embodiment is similar to the embodiment of FIG. 5, but is different in that: as shown in FIG. 6, the time generation circuit 32" of the secondary side controller circuit 306 is configured to operably determine the length of the ZVS period T_ZVS further according to the output voltage Vo.

In one embodiment, the relationship among the length of the ZVS period, the input voltage Vin and the output voltage Vo can be determined according to the above-mentioned equation (1) of zero voltage switching. That is, an optimum solution of the ZVS period T_ZVS of the ZVS pulse PZV can be obtained by the following equation (1):

$$T\_ZVS = \frac{\sqrt{[Vin^2 - (nVo)^2]\frac{Cp}{Lm}}}{nVo} \qquad \text{eq. 1}$$

In one embodiment, the secondary side controller circuit can be directly coupled to the output voltage Vo, so that the secondary side controller circuit can determine the length of the ZVS period T_ZVS further according to the output voltage Vo.

In another embodiment, during a period (e.g., from the time point t4 to the time point t5 in FIG. 2, namely TVo_sampling) between an ending time point of the SR pulse PSR to a following starting time point of the ZVS pulse PZV, the secondary side controller circuit samples-and-holds a voltage VDS2 of the first end of the SR switch S2 to be a second voltage Vv2, and the secondary side controller circuit determines the length of the ZVS period T_ZVS further according to the second voltage Vv2. The second voltage Vv2 is proportional to the output voltage Vo.

Figure 7:
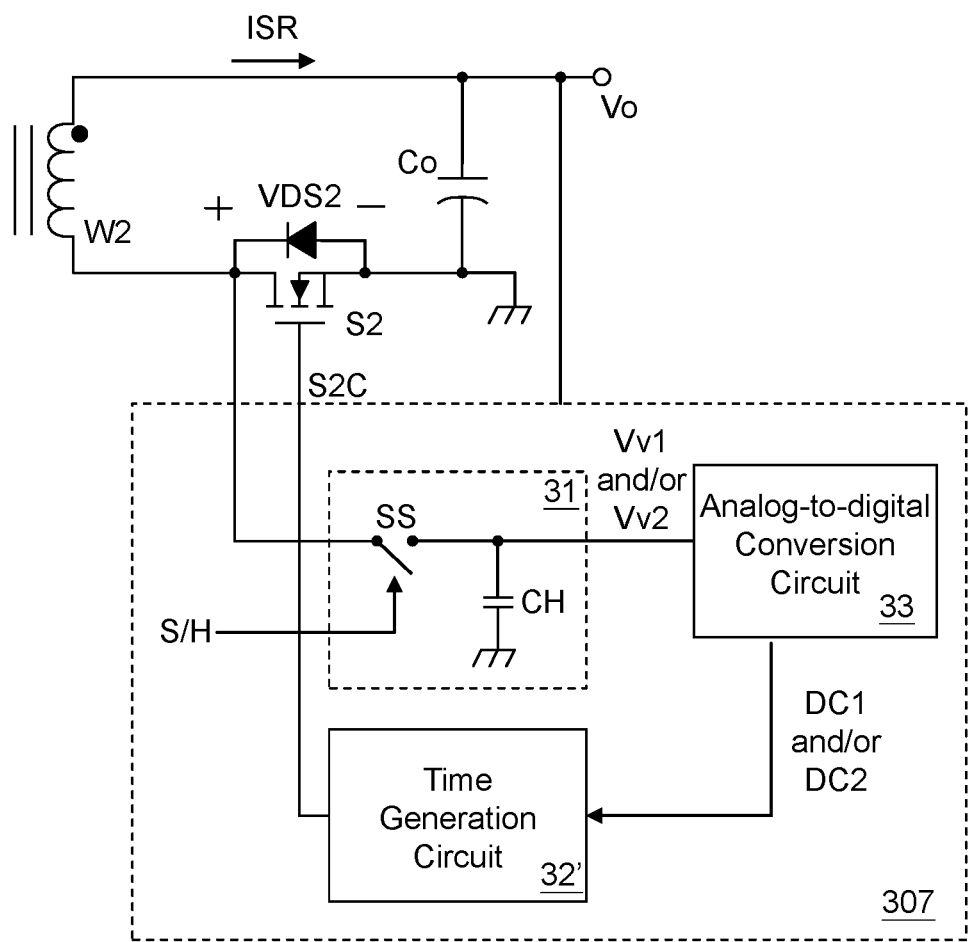
FIG. 7 shows still another embodiment of a secondary side controller circuit according to the present invention.

Please refer to FIG. 7, which shows still another embodiment of a secondary side controller circuit (i.e., secondary side controller circuit 307) for use in a flyback power converter according to the present invention. This embodiment is similar to the embodiment of FIG. 5, but is different in that: as shown in FIG. 7, in the secondary side controller circuit 307, the sample-and-hold circuit 31 and the analog-to-digital conversion circuit 33 are configured to operably sense the input voltage Vin or the output voltage Vo at different periods. The time generation circuit 32 is configured to operably determine the length of the ZVS period T_ZVS according to the input voltage Vin or output voltage Vo sensed at different periods.

More specifically, the sample-and-hold circuit 31 samples-and-holds the voltage VDS2 of the first end of the SR switch S2 to be the first voltage Vv1 during a period (e.g., from the time point t1 to the time point t3 in FIG. 2) between the ending time point of the ZVS pulse PZV to the following starting time point of the SR pulse PSR, and the analog-to-digital conversion circuit 33 converts the first voltage Vv1 to a first digital code DC1 corresponding to the first voltage Vv1. Furthermore, in this embodiment, the sample-and-hold circuit 31 further samples-and-holds the voltage VDS2 of the first end of the SR S2 switch to be the second voltage Vv2 during a period (e.g., from the time point t4 to the time point t5 in FIG. 2) between an ending time point of the SR pulse PSR to a following starting time point of the ZVS pulse PZV, and the analog-to-digital conversion circuit 33 converts the second voltage Vv2 to a second digital code DC2 corresponding to the second voltage Vv2. The time generation circuit 32' determines the length of the ZVS period T_ZVS according to the first digital code DC1 (corresponding to the input voltage Vin) and the second digital code DC2 (corresponding to the output voltage Vo). More specifically, as shown in FIG. 2, under DCM, after the power transformer 10 has been demagnetized, the secondary side current ISR is reduced to zero, and a resonance will occur in the power transformer 10 (e.g., referring to the period from the time point t4 to the time point t5 in FIG. 2), and the waveform of the voltage VDS2 of the first end of the SR switch S2 will show such resonance waveform whose amplitude is related to the output voltage. Accordingly, through sampling-and-holding the voltage VDS2 of the first end of the SR S2 switch to be a second voltage Vv2 during a period (e.g., from the time point t4 to the time point t5 in FIG. 2) between an ending time point of the SR pulse PSR to a following starting time point of the ZVS pulse PZV, this embodiment can obtain information related to the output voltage Vo, for determining the length of the ZVS period T_ZVS.

Figure 10:
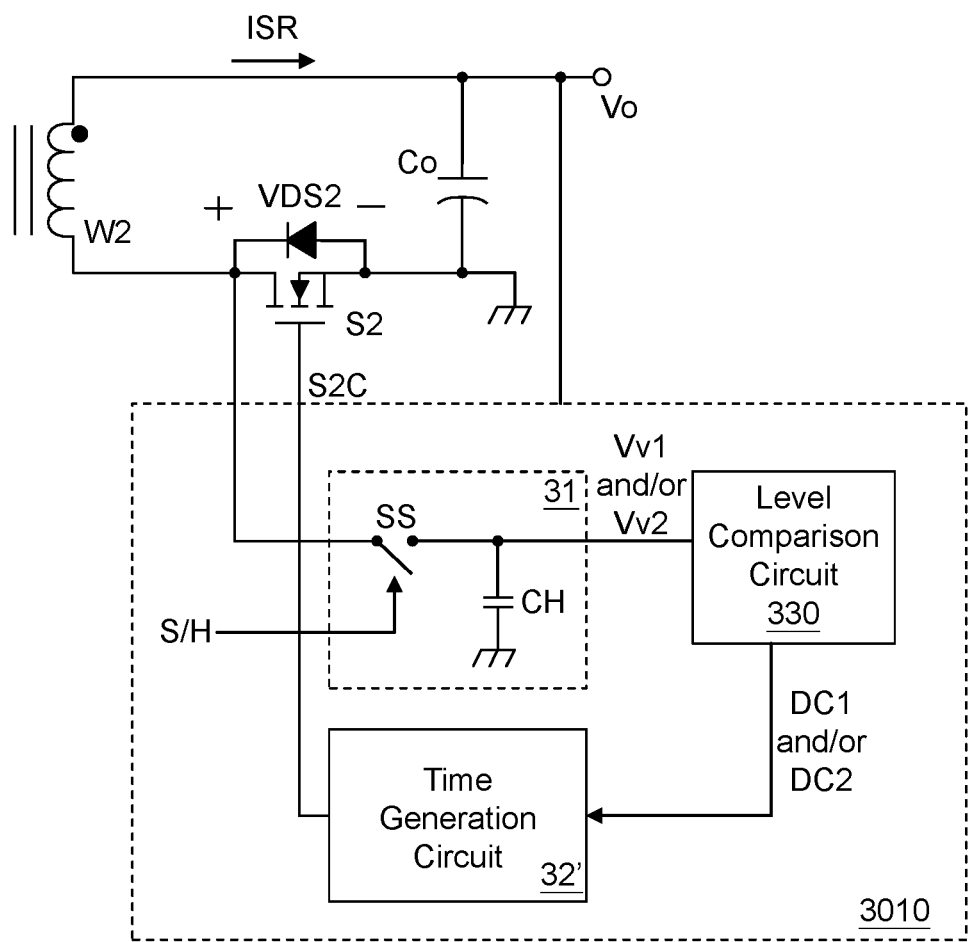
FIG. 10 shows still another embodiment of a secondary side controller circuit according to the present invention.

Please refer to FIG. 10, which shows still another embodiment of a secondary side controller circuit (i.e., secondary side controller circuit 3010) for use in a flyback power converter according to the present invention. From one perspective, the above-mentioned analog-to-digital conversion circuit 33 can be regarded as a level comparison circuit (e.g., as shown by the level comparison circuit 330 in FIG. 10). The level comparison circuit 330 is configured to operably compare the first voltage Vv1 with at least one reference level, to generate a corresponding first comparison result (which corresponds to the above-mentioned first digital code DC1), and/or, to operably compare the second voltage Vv2 with at least one reference level, to generate a corresponding second comparison result (which corresponds to the above-mentioned second digital code DC2). The first comparison result and the second comparison result can be employed alone or together to determine the length of the ZVS period T_ZVS. The approach as to how the first comparison result and the second comparison result are employed alone or together to determine the length of the ZVS period T_ZVS for example can be one of the following. In one embodiment, the secondary side controller circuit 3010 can select one among plural lengths of the ZVS period T_ZVS according to the first comparison result and/or the second comparison result. In another embodiment, the secondary side controller circuit 3010 can compute the required length of the ZVS period T_ZVS according to the first comparison result and/or the second comparison result. The embodiment of FIG. 10 can be regarded as a genius form of the embodiment employing the analog-to-digital conversion circuit 33 and the digital codes generated by the analog-to-digital conversion circuit 33.

Figure 11A:
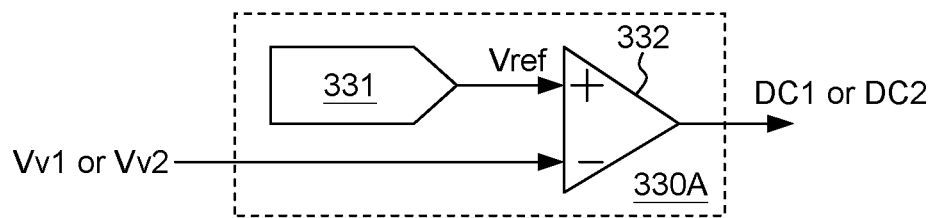
FIG. 11A and FIG. 11B show two specific embodiments of a level comparison circuit according to the present invention, respectively.
Figure 11B:
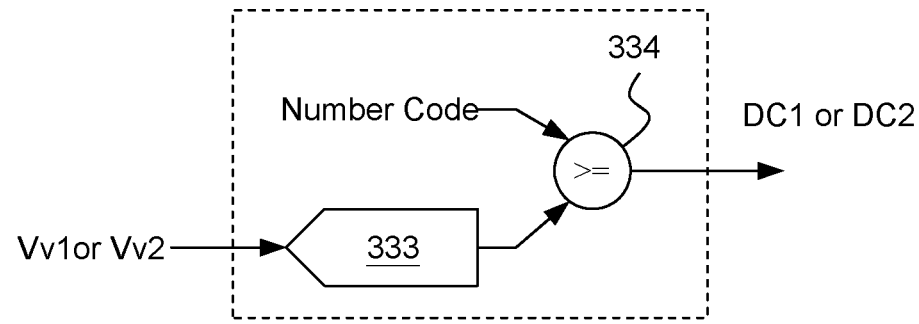

Please refer to FIG. 11A and FIG. 11B, which show two specific embodiments of a level comparison circuit (i.e., level comparison circuit 330A and 330B), respectively, for use in a flyback power converter according to the present invention. As shown in FIG. 11A, in one embodiment, the level comparison circuit 330A includes: a digital-to-analog conversion circuit 331 and a voltage comparison circuit 332. The digital-to-analog conversion circuit 331 is configured to operably convert a digital number to a reference level Vref in analog form. The voltage comparison circuit 332 is configured to operably compare the first voltage Vv1 or the second voltage Vv2 with the reference level Vref which is in analog form, to generate the corresponding first comparison result (corresponding to the above-mentioned first digital code DC1) or the corresponding second comparison result (corresponding to the above-mentioned second digital code DC2).

As shown in FIG. 11B, in another embodiment, the level comparison circuit 330B includes: an analog-to-digital conversion circuit 333 and a digital comparison circuit 334. The analog-to-digital conversion circuit 333 is configured to operably convert the first voltage Vv1 to generate a digital code corresponding to the first voltage Vv1, and/or, to operably convert the second voltage Vv2 to generate a digital code corresponding to the second voltage Vv2. The digital comparison circuit 334 is configured to operably compare the digital code generated by the analog-to-digital conversion circuit 333 with a digital number, to generate the corresponding first comparison result (corresponding to the first digital code DC1 shown in FIG. 11B) or the corresponding second comparison result (corresponding to the second digital code DC2 shown in FIG. 11B). The digital number corresponds to the above-mentioned level Vref. In other words, in this embodiment, the reference level Vref is in digital form.

Figure 8:
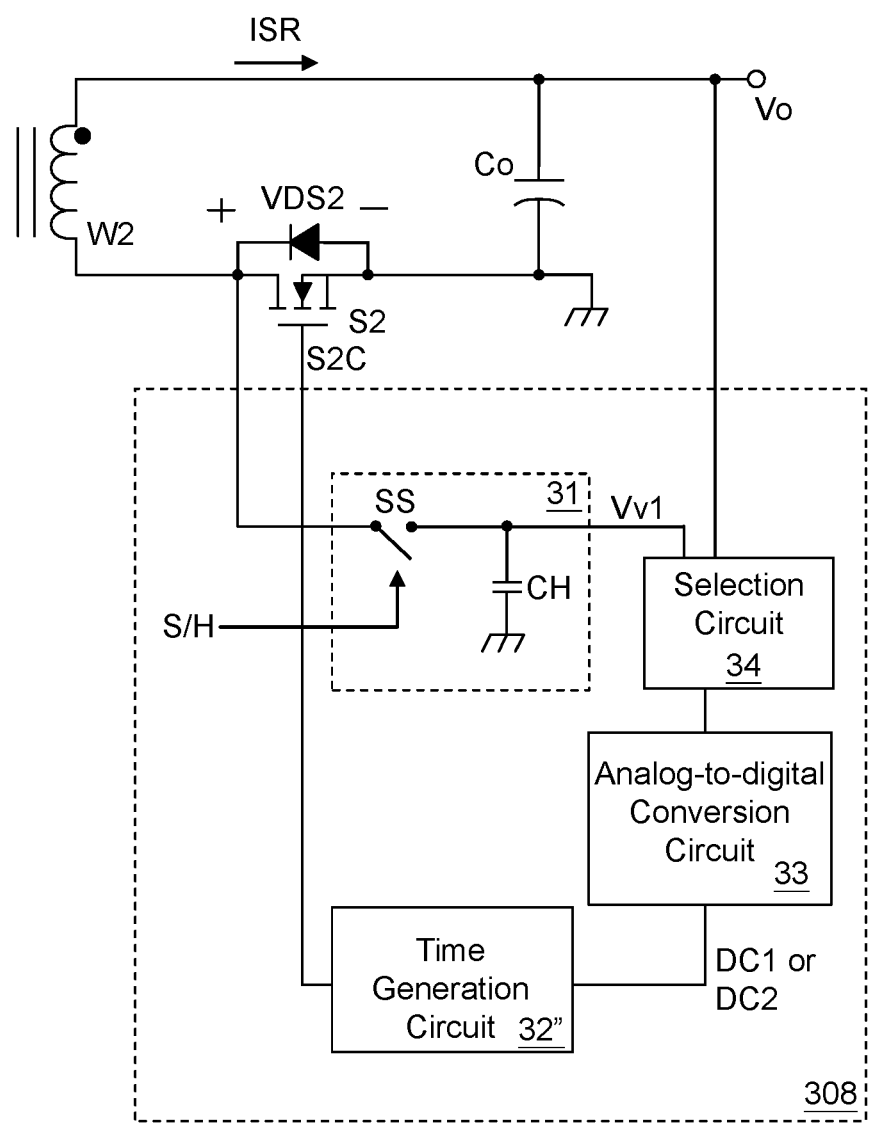
FIG. 8 shows still another embodiment of a secondary side controller circuit according to the present invention.

Please refer to FIG. 8, which shows still another embodiment of a secondary side controller circuit (i.e., secondary side controller circuit 308) for use in a flyback power converter according to the present invention. This embodiment is similar to the embodiment of FIG. 5, but is different in that: as shown in FIG. 8, in this embodiment the secondary side controller circuit 308 further includes a selection circuit 34. The selection circuit is configured to operably control the analog-to-digital conversion circuit 33, to determine whether the analog-to-digital conversion circuit 33 receives the first voltage Vv1 or the output voltage Vo. In this embodiment, under a situation where the analog-to-digital conversion circuit 33 receives the first voltage Vv1, the analog-to-digital conversion circuit 33 is configured to operably convert the first voltage Vv1 to a corresponding first digital code DC1, whereas, under a situation where the analog-to-digital conversion circuit 33 receives the output voltage Vo, the analog-to-digital conversion circuit 33 is configured to operably convert the output voltage Vo to a corresponding second digital code DC2. In this embodiment, the time generation circuit 32" is configured to operably determine the length of the ZVS period T_ZVS according to the first digital code DC1 (corresponding to the first voltage Vv1) or the second digital code DC2 (corresponding to the output voltage Vo).

Please refer back to FIG. 2. In one embodiment, the above-mentioned secondary side controller circuit (for example but not limited to the secondary side controller circuit 304, 306, 307, or 308) samples-and-holds the voltage VDS2 of the first end of the SR switch S2 to be the first voltage Vv1 after a delay period Tvi from an ending time point of the ZVS pulse PZV (e.g., referring to the delay period Tvi following right after the time point t1 in FIG. 2). In one embodiment, at the ending time point of the delay period Tvi, the voltage VDS2 of the first end of the SR switch S2 has already been stable. More specifically, taking the embodiments shown in FIG. 2 and FIG. 4 as examples, the above-mentioned secondary side controller circuit (304, 306, 307, or 308) starts counting for the delay period Tvi from the time point t1. At the time point t2', the secondary side controller circuit (304, 306, 307, or 308) for example controls the switch SS to be OFF, thus sampling-and-holding the voltage VDS2 (which is stored in the holding capacitor CH) of the first end of the SR switch S2 to be the first voltage Vv1.

Figure 9:
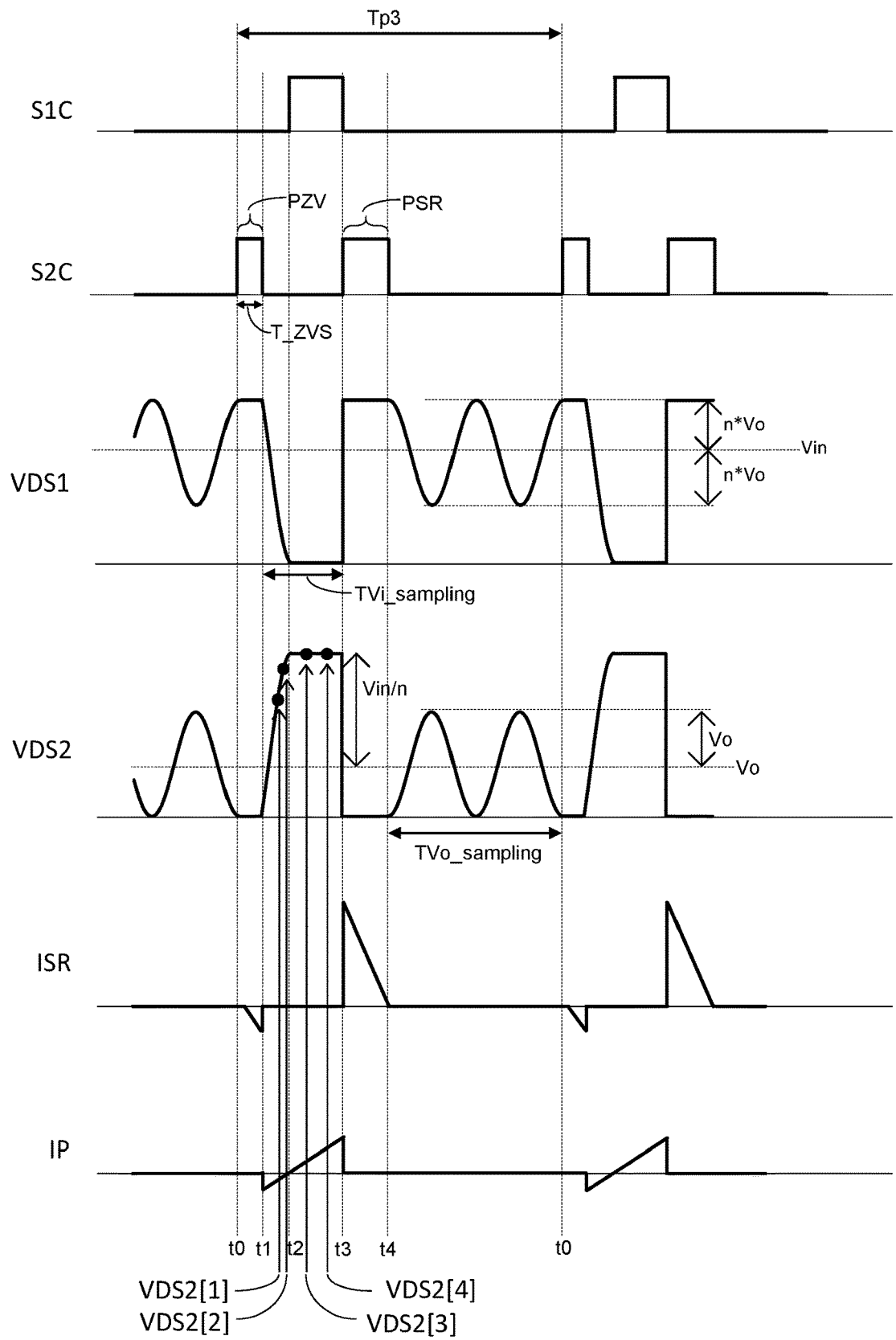
FIG. 9 illustrates a waveform diagram depicting the operation of a flyback power converter according to the present invention.

Please refer to FIG. 9, which illustrates a waveform diagram depicting the operation of a flyback power converter according to the present invention. In one embodiment, starting from an ending time point (e.g., the time point t1 in FIG. 9) of the ZVS pulse PZV, the above-mentioned secondary side controller circuit (for example but not limited to the secondary side controller circuit 304, 306, 307, or 308) samples-and-holds the voltage VDS2 of the first end of the SR switch S2 for plural times (e.g., as shown by the voltages VDS2 [1], VDS2[2], VDS2[3] and VDS2 [4] in FIG. 9) until a difference between two consecutive sample-and-hold results is smaller than a predetermined difference threshold; when the difference between the two consecutive sample-and-hold results is smaller than the predetermined difference threshold, the secondary side controller circuit (304, 306, 307, or 308) takes the last sample-and-hold result as the first voltage Vv1. More specifically, as shown in FIG. 9, starting from an ending time point (e.g., the time point t1 in FIG. 9) of the ZVS pulse PZV, the secondary side controller circuit (304, 306, 307, or 308) successively samples-and-holds the voltage VDS2 of the first end of the SR switch S2 for plural times, as shown by the voltages VDS2[1], VDS2[2], VDS2[3] and VDS2[4] in FIG. 9. In this embodiment, because a difference between the voltages VDS2 [3] and VDS2 [4] is smaller than the predetermined difference threshold, which indicates that the voltage VDS2 has been stable, the secondary side controller circuit (304, 306, 307, or 308) takes the last sample-and-hold result as the first voltage Vv1.

The present invention has been described in considerable detail with reference to certain preferred embodiments thereof. It should be understood that the description is for illustrative purpose, not for limiting the scope of the present invention. An embodiment or a claim of the present invention does not need to achieve all the objectives or advantages of the present invention. The title and abstract are provided for assisting searches but not for limiting the scope of the present invention. Those skilled in this art can readily conceive variations and modifications within the spirit of the present invention. For example, to perform an action "according to" a certain signal as described in the context of the present invention is not limited to performing an action strictly according to the signal itself, but can be performing an action according to a converted form or a scaled-up or down form of the signal, i.e., the signal can be processed by a voltage-to-current conversion, a current-to-voltage conversion, and/or a ratio conversion, etc. before an action is performed. It is not limited for each of the embodiments described hereinbefore to be used alone; under the spirit of the present invention, two or more of the embodiments described hereinbefore can be used in combination. For example, two or more of the embodiments can be used together, or, a part of one embodiment can be used to replace a corresponding part of another embodiment. In view of the foregoing, the spirit of the present invention should cover all such and other modifications and variations, which should be interpreted to fall within the scope of the following claims and their equivalents.

What is claimed is:

1. A flyback power converter, which is configured to operably convert an input voltage to an output voltage; the flyback power converter comprising:
    a power transformer, which is coupled between the input voltage and the output voltage;
    a primary side switch, which is coupled to a primary side winding of the power transformer, wherein the primary side winding is coupled to the input voltage;
    a synchronous rectification (SR) switch, wherein a secondary side winding of the power transformer and the SR switch are coupled in series to each other between the output voltage and a secondary side ground node;
    a primary side controller circuit, which is configured to operably generate a switching signal, to control the primary side switch, thereby controlling the primary side winding of the power transformer; and
    a secondary side controller circuit, which is configured to operably generate an SR signal, to control the SR switch, thereby controlling the secondary side winding of the power transformer to generate output voltage, wherein the SR signal includes an SR pulse and a zero voltage switching (ZVS) pulse, wherein the SR pulse is configured to operably control the SR switch to be ON for an SR period, to achieve synchronous rectification at the secondary side, and wherein the ZVS pulse is configured to operably control the SR switch to be ON for a ZVS period, thereby achieving zero voltage switching of the primary side switch;
    wherein during a period between an ending time point of the ZVS pulse to a following starting time point of the SR pulse, the secondary side controller circuit is configured to operably sample-and-hold a voltage of a first end of the SR switch to be a first voltage and the secondary side controller circuit is configured to operably determine a length of the ZVS period according to the first voltage, wherein the first voltage is proportional to the input voltage, and wherein the first end of the SR switch corresponds to a current output end or a current input end of the SR switch.

2. The flyback power converter of claim 1, wherein the secondary side controller circuit includes:
    a sample-and-hold circuit, which is configured to operably sample-and-hold the voltage of the first end of the SR switch to be the first voltage during the period between the ending time point of the ZVS pulse to the following starting time point of the SR pulse;
    a level comparison circuit, which is configured to operably compare the first voltage with at least one reference level, to generate a first comparison result corresponding to the first voltage; and
    a time generation circuit, which is configured to operably determine the length of the ZVS period according to the first comparison result corresponding to the first voltage.

3. The flyback power converter of claim 2, wherein the secondary side controller circuit is configured to operably determine the length of the ZVS period further according to the output voltage.

4. The flyback power converter of claim 3, wherein the secondary side controller circuit is directly coupled to the output voltage, to operably determine the length of the ZVS period further according to the output voltage.

5. The flyback power converter of claim 3, wherein:
    during a period between an ending time point of the SR pulse to a following starting time point of the ZVS pulse, the secondary side controller circuit is configured to operably sample-and-hold a voltage of the first end of the SR switch to be a second voltage, and the secondary side controller circuit is configured to operably determine the length of the ZVS period further according to the second voltage, wherein the second voltage is proportional to the output voltage.

6. The flyback power converter of claim 5, wherein:
    the sample-and-hold circuit is further configured to operably sample-and-hold the voltage of the first end of the SR switch to be the second voltage during the period between the ending time point of the SR pulse to the following starting time point of the ZVS pulse;
    the level comparison circuit is further configured to operably compare the second voltage with the least one reference level, to generate a second comparison result corresponding to the second voltage; and
    the time generation circuit is further configured to operably determine the length of the ZVS period further according to the second comparison result corresponding to the second voltage.

7. The flyback power converter of claim 4, wherein the secondary side controller circuit further includes:
    a selection circuit, which is configured to operably determine whether the level comparison circuit receives the first voltage or the output voltage;
    wherein when the level comparison circuit receives the first voltage, the level comparison circuit is configured to operably compare the first voltage with the at least one reference level, to generate the first comparison result corresponding to the first voltage;
    wherein when the level comparison circuit receives the output voltage, the level comparison circuit is configured to operably compare the output voltage with the at least one reference level, to generate the second comparison result corresponding to the second voltage;
    wherein the time generation circuit is configured to operably determine the length of the ZVS period according to the first comparison result corresponding to the first voltage and the second comparison result corresponding to the second voltage.

8. The flyback power converter of claim 1, wherein the secondary side controller circuit is configured to operably sample-and-hold the voltage of the first end of the SR switch to be the first voltage after a delay period from an ending time point of the ZVS pulse; wherein at the ending time point of the delay period, the voltage of the first end of the SR switch has already been stable.

9. The flyback power converter of claim 1, wherein starting from an ending time point of the ZVS pulse, the secondary side controller circuit is configured to operably sample-and-hold the voltage of the first end of the SR switch for plural times until a difference between two consecutive sample-and-hold results is smaller than a predetermined difference threshold; wherein under a situation where the two consecutive sample-and-hold results is smaller than the predetermined difference threshold, the secondary side controller circuit takes a last sample-and-hold result as the first voltage.

10. The flyback power converter of claim 1, wherein the input voltage is equal to n-fold of the first voltage, wherein n is a turn ratio of the primary side winding to the secondary side winding.

11. The flyback power converter of claim 1, wherein the flyback power converter operates under a discontinuous conduction mode (DCM) or a boundary conduction mode (BCM).

12. The flyback power converter of claim 2, wherein the level comparison circuit is configured as one of the following:
(1) the level comparison circuit includes:
a digital-to-analog conversion circuit, which is configured to operably generate the at least one reference level in analog form; and
a voltage comparison circuit, which is configured to operably compare the first voltage with the at least one reference level in analog form, to generate the first comparison result; or
(2) the level comparison circuit includes:
an analog-to-digital conversion circuit, which is configured to operably convert the first voltage to a first digital code corresponding to the first voltage; and
a digital comparison circuit, which is configured to operably compare the first digital code with a digital level, to generate the first comparison result, wherein the digital level corresponds to the at least one reference level.

13. A secondary side controller circuit, which is configured to operably control a flyback power converter, wherein the flyback power converter is configured to operably convert an input voltage to an output voltage, the flyback power converter including: a power transformer, which is coupled between the input voltage and the output voltage; a primary side switch, which is coupled to a primary side winding of the power transformer, wherein the primary side winding is coupled to the input voltage; a synchronous rectification (SR) switch, wherein a secondary side winding of the power transformer and the SR switch are coupled in series to each other between the output voltage and a secondary side ground node; and a primary side controller circuit, which is configured to operably generate a switching signal, to control the primary side switch, thereby controlling the primary side winding of the power transformer; wherein the secondary side controller circuit is configured to operably generate an SR signal, to control the SR switch, thereby controlling the secondary side winding of the power transformer, so as to generate output voltage, wherein the SR signal includes an SR pulse and a zero voltage switching (ZVS) pulse, wherein the SR pulse is configured to operably control the SR switch to be ON for an SR period, to achieve synchronous rectification at the secondary side, and wherein the ZVS pulse is configured to operably control the SR switch to be ON for a ZVS period, thereby achieving zero voltage switching of the primary side switch; the secondary side controller circuit comprising:

a sample-and-hold circuit, which is configured to operably sample-and-hold a voltage of a first end of the SR switch to be a first voltage during a period between an ending time point of the ZVS pulse to a following starting time point of the SR pulse, wherein the first voltage is proportional to the input voltage, and wherein the first end of the SR switch corresponds to a current output end or a current input end of the SR switch; and
a time generation circuit, which is configured to operably determine the length of the ZVS period according to the first voltage.

14. The secondary side controller circuit of claim 13, wherein the secondary side controller circuit is configured to operably determine the length of the ZVS period further according to the output voltage.

15. The secondary side controller circuit of claim 14, wherein the secondary side controller circuit is directly coupled to the output voltage, to operably determine the length of the ZVS period further according to the output voltage.

16. The secondary side controller circuit of claim 14, wherein during a period between an ending time point of the SR pulse to a following starting time point of the ZVS pulse, the secondary side controller circuit is further configured to operably sample-and-hold a voltage of the first end of the SR switch to be a second voltage and the secondary side controller circuit is configured to operably determine the length of the ZVS period further according to the second voltage, wherein the second voltage is proportional to the output voltage.

17. The secondary side controller circuit of claim 16, wherein:
the sample-and-hold circuit is further configured to operably sample-and-hold the voltage of the first end of the SR switch to be the second voltage during the period between the ending time point of the SR pulse to the following starting time point of the ZVS pulse; and
the time generation circuit is further configured to operably determine the length of the ZVS period further according to the second voltage.

18. The secondary side controller circuit of claim 15, wherein the secondary side controller circuit further includes:
a selection circuit, which is configured to operably determine whether the level comparison circuit receives the first voltage or the output voltage;
wherein the time generation circuit is configured to operably obtain information of the first voltage or information of the output voltage according to a selection result of the selection circuit and the time generation circuit is configured to operably determine the length of the ZVS period according to the first voltage and the output voltage.

19. The secondary side controller circuit of claim 13, wherein the secondary side controller circuit is configured to operably sample-and-hold the voltage of the first end of the SR switch to be the first voltage after a delay period from an ending time point of the ZVS pulse; wherein at the ending time point of the delay period, the voltage of the first end of the SR switch has already been stable.

20. The secondary side controller circuit of claim 13, wherein starting from an ending time point of the ZVS pulse, the secondary side controller circuit is configured to operably sample-and-hold the voltage of the first end of the SR switch for plural times until a difference between two consecutive sample-and-hold results is smaller than a predetermined difference threshold; wherein under a situation where the two consecutive sample-and-hold results is smaller than the predetermined difference threshold, the secondary side controller circuit takes a last sample-and-hold result as the first voltage.

21. A control method for controlling a flyback power converter, wherein the flyback power converter is configured to operably convert an input voltage to an output voltage, the flyback power converter including: a power transformer, which is coupled between the input voltage and the output voltage; a primary side switch, which is coupled to a primary side winding of the power transformer, wherein the primary side winding is coupled to the input voltage; a synchronous rectification (SR) switch, wherein a secondary side winding of the power transformer and the SR switch are coupled in series to each other between the output voltage and a secondary side ground node; and a primary side controller circuit, which is configured to operably generate a switching signal, to control the primary side switch, thereby controlling the primary side winding of the power transformer; wherein the secondary side controller circuit is configured to operably generate an SR signal, to control the SR switch, thereby controlling the secondary side winding of the power transformer to generate output voltage, wherein the SR signal includes an SR pulse and a zero voltage switching (ZVS) pulse, wherein the SR pulse is configured to operably control the SR switch to be ON for an SR period, to achieve synchronous rectification at the secondary side, and wherein the ZVS pulse is configured to operably control the SR switch to be ON for a ZVS period, thereby achieving zero voltage switching of the primary side switch; the control method comprising:

during a period between an ending time point of the ZVS pulse to a following starting time point of the SR pulse, sampling-and-holding a voltage of a first end of the SR switch to be a first voltage, wherein the first voltage is proportional to the input voltage, and wherein the first end of the SR switch corresponds to a current output end or a current input end of the SR switch; and determining a length of the ZVS period according to the first voltage.

22. The control method of claim 21, further comprising:

during a period between an ending time point of the SR pulse to a following starting time point of the ZVS pulse, sampling-and-holding a voltage of the first end of the SR switch to be a second voltage; and determining the length of the ZVS period further according to the second voltage, wherein the second voltage is proportional to the output voltage.

23. The control method of claim 21, wherein the step of sampling-and-holding the voltage of the first end of the SR switch to be the first voltage includes:

sampling-and-holding the voltage of the first end of the SR switch to be the first voltage after a delay period from an ending time point of the ZVS pulse;

wherein at the ending time point of the delay period, the voltage of the first end of the SR switch has already been stable.

24. The control method of claim 21, wherein the step of sampling-and-holding the voltage of the first end of the SR switch to be the first voltage includes:

starting from an ending time point of the ZVS pulse, sampling-and-holding the voltage of the first end of the SR switch for plural times until a difference between two consecutive sample-and-hold results is smaller than a predetermined difference threshold; and when the two consecutive sample-and-hold results is smaller than the predetermined difference threshold, taking a last sample-and-hold result as the first voltage.

* * * * *